United States Patent [19]
Yang et al.

[11] Patent Number: 5,990,004
[45] Date of Patent: Nov. 23, 1999

[54] METHOD FOR FORMING A TUNGSTEN PLUG AND A BARRIER LAYER IN A CONTACT OF HIGH ASPECT RATIO

[75] Inventors: Yu-Ru Yang, Yi Lan; Horng-Bor Lu; Jenn-Tarng Lin, both of Hsinchu, all of Taiwan

[73] Assignee: United Microelectronics Corp., Hsinchu, Taiwan

[21] Appl. No.: 09/115,944

[22] Filed: Jul. 15, 1998

[51] Int. Cl.[6] .................... H01L 21/44; H01L 21/4763
[52] U.S. Cl. .................... 438/648; 438/643; 438/644; 438/668; 438/675; 438/629
[58] Field of Search .................... 438/648, 643, 438/644, 668, 675, 629

[56] References Cited

U.S. PATENT DOCUMENTS

| | | | |
|---|---|---|---|
| 4,141,022 | 2/1979 | Sigg et al. | 357/23 |
| 4,920,071 | 4/1990 | Thomas | 437/188 |
| 5,104,826 | 4/1992 | Fujita et al. | 437/190 |
| 5,250,467 | 10/1993 | Somekh et al. | 437/192 |
| 5,502,008 | 3/1996 | Hayakawa et al. | 437/225 |
| 5,525,543 | 6/1996 | Chen | 437/190 |
| 5,591,672 | 1/1997 | Lee et al. | 437/190 |
| 5,693,561 | 12/1997 | Merchant et al. | 437/190 |
| 5,700,716 | 12/1997 | Sharan et al. | 437/190 |
| 5,780,356 | 7/1998 | Kim | 438/627 |
| 5,833,817 | 11/1998 | Tsai et al. | 204/192.17 |
| 5,877,086 | 3/1999 | Aruga | 438/653 |

*Primary Examiner*—Charles Bowers
*Assistant Examiner*—Sam Lee

[57] ABSTRACT

A method for forming a barrier layer inside a contact in a semiconductor wafer is disclosed herein. The forgoing semiconductor wafer includes a dielectric layer on a silicon contained layer. A portion of the silicon contained layer is exposed by the contact. The method mentioned above includes the following steps.

First, form a conductive layer on the topography of the semiconductor wafer by a method other than CVD to increase the ohmic contact to the exposed silicon contained layer. Thus a first portion of the conductive layer is formed on the dielectric layer, and a second portion of the conductive layer is formed on the exposed silicon contained layer. Next, remove the first portion of the conductive layer to expose the dielectric layer. Finally, use a chemical vapor deposition (CVD) method to form the barrier layer on the dielectric layer and the first portion of the conductive layer to prevent said silicon contained layer from exposure.

5 Claims, 4 Drawing Sheets

METHOD FOR FORMING A TUNGSTEN PLUG AND A BARRIER LAYER IN A CONTACT OF HIGH ASPECT RATIO

BACKGROUND OF THE INVENTION

1. Field of the Invention

This invention relates to a method for forming a barrier layer in a contact, and particularly relates to a method for forming a barrier layer in a contact of high aspect ratio.

2. Description of the Prior Art

To increase the ohmic contact between the barrier layer and the silicon containing layer, a Ti layer is frequently deposited between the silicon containing layer and the TiN layer. The TiN layer is used as a barrier layer between a metal layer and a silicon containing layer. When forming a plug in a contact, the barrier layer is usually used to prevent the spike produced at the interface of the plug (usually formed of metal tungsten or aluminum) and the silicon containing layer. The TiN (titanium nitride) is usually used to form the barrier layer mentioned above. So the Ti layer together with the TiN layer is frequently used before the deposition of plug or interconnection.

To form the TiN barrier layer and the Ti layer in a contact, the ionized PVD (Physical Vapor Deposition) or the traditional collimator is frequently used in the semiconductor industry. Though the step coverage of the TiN layer and the Ti layer is improved, yet the step coverage of the TiN layer and the Ti layer in a contact of high aspect ratio is still a problem.

Take a tungsten plug fabricating process for example, before forming the tungsten plug, referring to FIG. 1, it is necessary to form a contact in the inter poly oxide layer 10 on the silicon contained layer 11, the inter poly oxide layer 10 is made of BPSG (Borophosphosilicate glass). Using the developed photoresist layer 13 as a mask, the etching stops at the surface of the silicon contained layer 11. The next step is to strip the photoresist layer 13, and to remove the residue polymer after forming the contact. The cross sectional view of the semiconductor wafer is shown in FIG. 2, in which the photoresist layer is removed, and a Ti layer 15 and a TiN layer 17 are subsequently formed on the topography of the semiconductor wafer. The silicon contained layer 11 can be a silicon substrate.

The method used to form the Ti layer and the TiN layer can be an ionized PVD (Physical Vapor Deposition) or a traditional sputtering technology using collimator. As shown in FIG. 2, because the contact is of high aspect ratio, and the method to form the barrier layer is the traditional method mentioned above, the step coverage of the Ti layer 15 and the TiN layer 17 is very poor. To form the tungsten plug, a portion of the Ti layer 15 and the TiN layer 17 on the inter poly oxide layer 10 is removed. As shown in FIG. 3, a first portion of the silicon contained layer 11 is not covered by the Ti layer 15 and the TiN layer 17 at the bottom of the contact. Whereas a second portion of the silicon contained layer 11 is covered by the Ti layer 15 and the TiN layer 17 at the bottom of the contact. To form the tungsten plug in the contact, the $WF_6$ is induced into the reaction chamber, as shown in FIG. 3. The $WF_6$ penetrates the first portion of the silicon contained layer 11 in the contact to react with the exposed Si and the exposed Ti, so the worm hole 19 in the silicon contained layer 11 is thus produced. The problem mentioned above becomes very serious especially when the contact is of a bowing profile.

Because of the worm hole 19, the Si leakage become very serious, and the electric characteristic of the device using the plug becomes worse. Referring to FIG. 4, a tungsten plug 21 is formed in the contact. Because it is very difficult to form the PVD barrier layer at the bottom of the contact with good step coverage, the tungsten plug formed in the forgoing steps may have high resistivity because of the worm hole. Especially, in the high aspect ratio contact, the condition mentioned above becomes more serious. To improve the problems mentioned above, it is necessary to improve the step coverage of the TiN layer 17 to prevent the $WF_6$ from reacting with the Si in the silicon contained layer 11 and the Ti in the Ti layer 15. Thus prevent the worm hole from being produced.

SUMMARY OF THE INVENTION

Because the traditional technology used to form the barrier layer can cause the poor step coverage of the barrier layer. So the present invention provides a method for forming a barrier layer inside a contact in a semiconductor wafer is disclosed herein. The forgoing semiconductor wafer includes a dielectric layer on a silicon contained layer. A portion of the silicon contained layer is exposed by the contact. The method mentioned above includes the following steps.

First, use a physical vapor deposition to form a titanium layer on a topography of the semiconductor wafer to increase the ohmic contact to the exposed silicon contained layer. Thus a first portion of the titanium layer is formed on the dielectric layer, and a second portion of the titanium layer is formed on the exposed silicon contained layer. Next, remove the first portion of the titanium layer to expose the dielectric layer. Finally, use a chemical vapor deposition (CVD) method to form the barrier layer on the dielectric layer and the first portion of the titanium layer to prevent said silicon contained layer from exposure.

BRIEF DESCRIPTION OF THE DRAWINGS

The above features of the present invention will be more clearly understood from consideration of the following descriptions in connection with accompanying drawings in which:

FIG. 1 shows a cross sectional view of a semiconductor wafer with a contact in the semiconductor wafer using a photoresist layer as a mask;

FIG. 2 shows a cross sectional view of a semiconductor wafer with the photoresist layer stripped followed by subsequently forming a Ti layer and a TiN layer on the topography of the semiconductor wafer;

FIG. 3 shows a cross sectional view of a semiconductor wafer after forming the barrier layer on the bottom of the contact, in addition, the $WF_6$ reacts with the substrate and the exposed titanium layer, a worm hole is formed thereof;

FIG. 4 shows a cross sectional view of a semiconductor wafer after forming a tungsten plug;

FIG. 5 shows a cross sectional view of a semiconductor wafer with a contact in the semiconductor wafer using a photoresist layer as a mask;

FIG. 6 shows a cross sectional view of a semiconductor wafer with the photoresist layer stripped followed by subsequently forming a Ti layer and a TiN layer on the topography of the semiconductor wafer;

FIG. 7 shows a cross sectional view of a semiconductor wafer after forming the barrier layer inside the contact and on the topography of the semiconductor wafer, in addition, the $WF_6$ is used to form the tungsten plug; and FIG. 8 shows a cross sectional view of a semiconductor wafer after forming a tungsten plug.

DESCRIPTION OF THE PREFERRED EMBODIMENT

In order to avoid the worm hole in the silicon contained layer during fabricating tungsten plug, the present invention provides a method for forming a TiN layer in a contact of high aspect ratio with good step coverage. Because it is very difficult to use PVD method to form the TiN layer at the bottom of the contact with better step coverage, the present invention provides a method other than PVD to form the TiN layer.

To form the Ti layer in a contact of high aspect ratio, the present invention utilizes the ionized PVD (Physical Vapor Deposition) or the traditional collimator to deposit the Ti layer to increase the ohmic contact. In addition, the present invention use the CVD (Chemical Vapor Deposition) method to form the TiN layer to increase the step coverage of the TiN layer in the contact.

Figure 1:
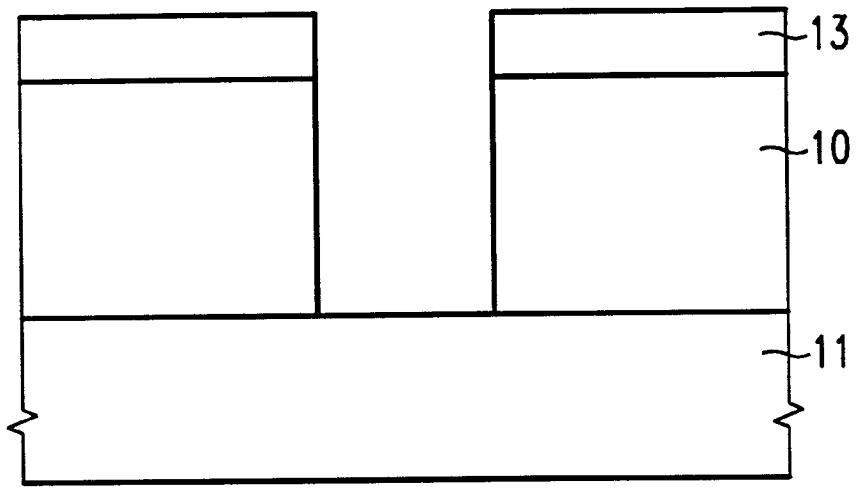
FIG. 1–FIG. 4 illustrates a serial of processes that used to fabricate the tungsten plug in the prior art.
Figure 2:
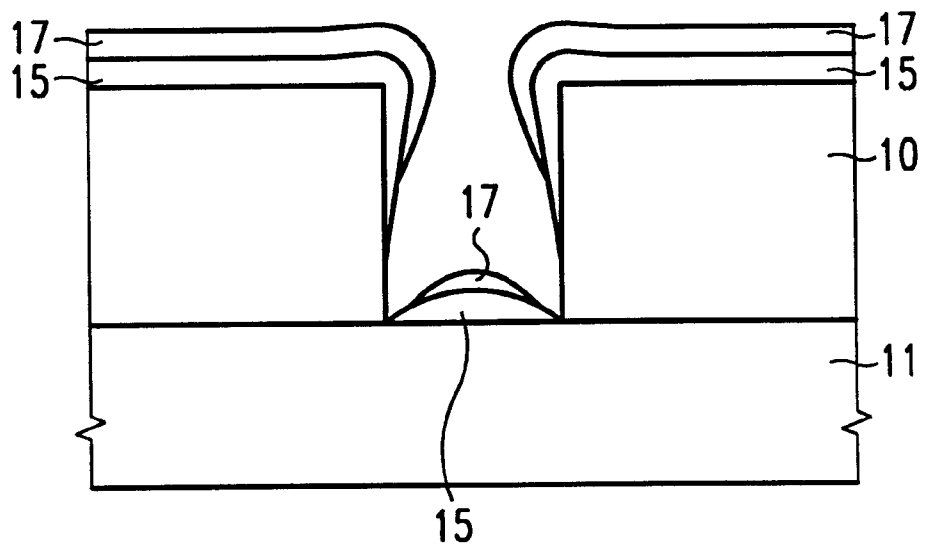
Figure 3:
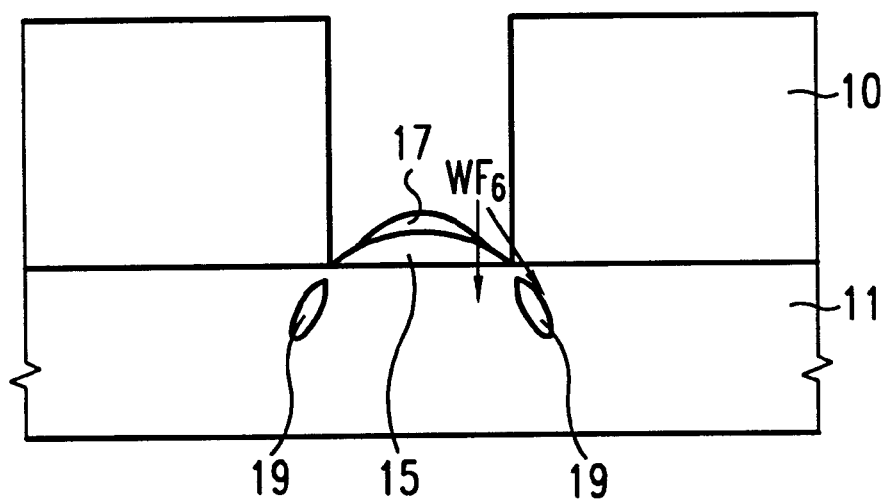
Figure 4:
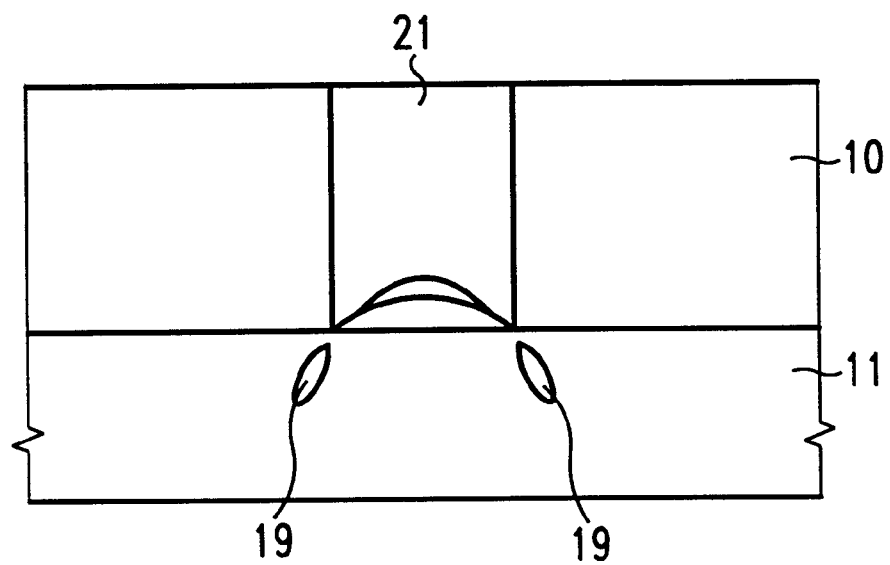
Figure 5:
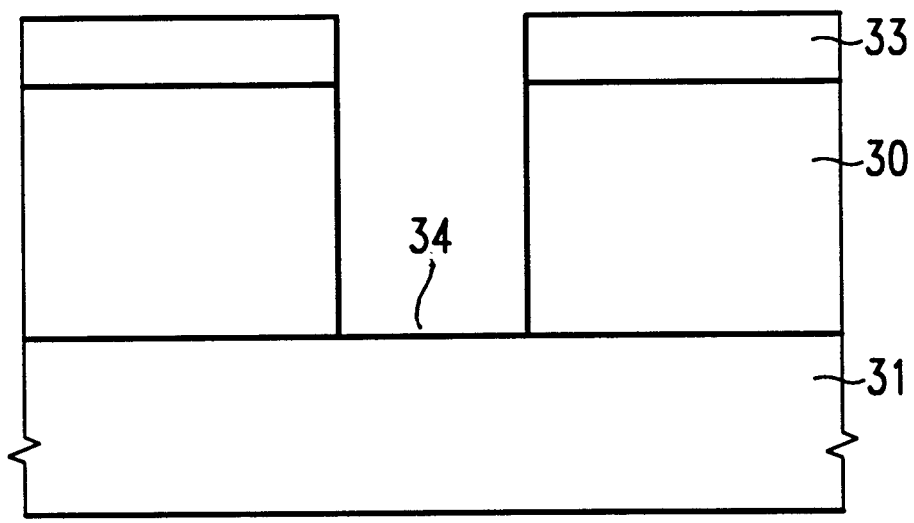
FIG. 5–FIG. 8 illustrates a serial of processes that used to fabricate the tungsten plug according to the preferred embodiment of the present invention.
Figure 6:
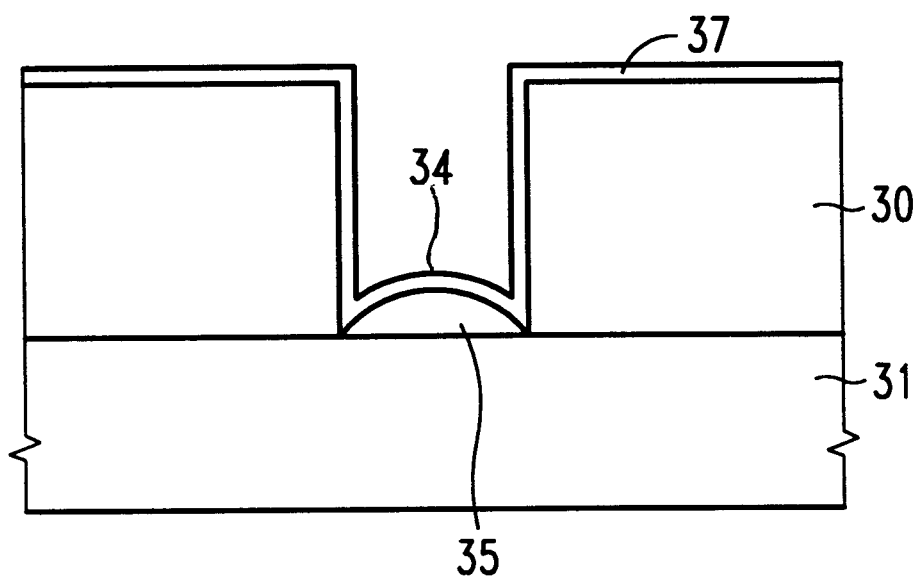

Take the tungsten plug fabricating process for example, referring to FIG. 5, form a contact in the dielectric layer, i.e. inter poly oxide layer 30, on the silicon contained layer 31, the inter poly oxide layer 30 is made of BPSG (Borophosphosilicate glass) or silicon dioxide. Using the developed photoresist layer 33 as a mask, the etching stops at the surface of the silicon contained layer 31. The silicon contained layer 31 can be silicon substrate. Next, strip the photoresist layer 33 after forming the contact 34. The cross sectional view of the semiconductor wafer is shown in FIG. 6, in which the photoresist layer is removed, and the Ti layer 35 and the TiN layer 37 are subsequently formed on the topography of the semiconductor wafer.

To get good step coverage of the Ti layer 35 at the bottom of the high aspect ratio contact 34, the ionized PVD method or the sputtering using collimator is used to form the Ti layer 35 in the preferred embodiment of the present invention. Because of the high aspect ratio contact 34, the thickness of the Ti layer 35 at the center of the contact 34 is greater than that at the corner of the contact 34. The Ti layer 35 on inter poly oxide layer 30 is removed followed by the deposition of the TiN layer 37. To form the TiN layer in the contact 34 of high aspect ratio, the present invention uses the CVD (Chemical Vapor Deposition) method to deposit the TiN layer 37 to increase the step coverage of the aforementioned TiN layer 37 in the contact 34. As shown in FIG. 6, the TiN layer 37 covers the surface of the contact 34 and the Ti layer 35; and the thickness of the TiN layer 37 is uniform.

Figure 7:
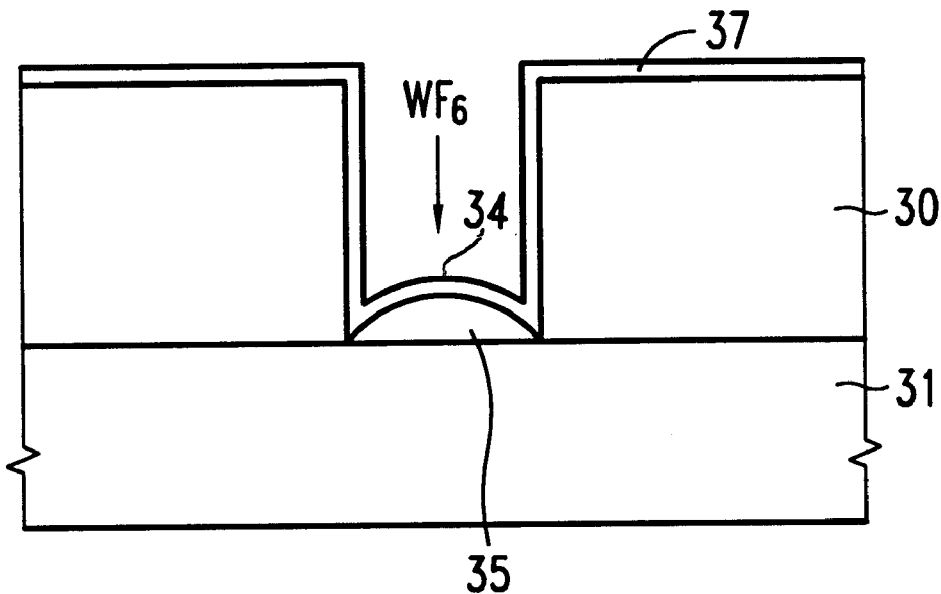

The next step is to induce the $WF_6$ into the reaction chamber (not shown) to produce tungsten plug. As illustrated in FIG. 7, because the TiN layer 37 covers the surface of the inter poly oxide layer 30 and the surface of the silicon contained layer 31 at the bottom of the contact 34. So the $WF_6$ can not react with the Si in the silicon contained layer 31 and the Ti in the Ti layer 35. Even the contact 34 is of the bowing profile, because the characteristic of CVD, the step coverage of the TiN layer 37 is still very good. And thus the TiN layer 37 cover the surface of the inter poly oxide layer 30 and the surface of the silicon contained layer 31 at the bottom of the contact 34. Thus, according to the preferred embodiment of the present invention, there is not any worm hole produced during fabricating the tungsten plug.

Figure 8:
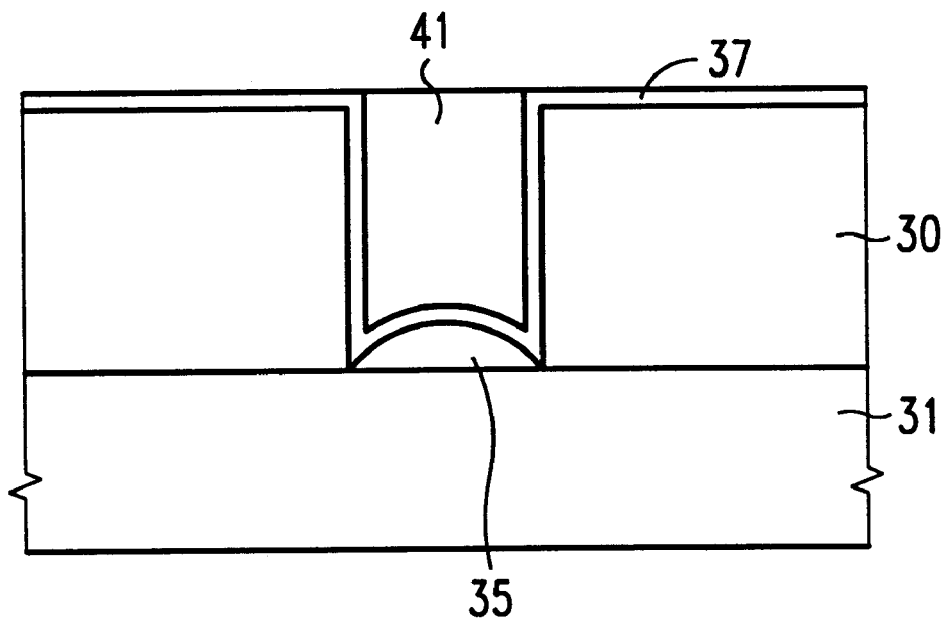

Because the present invention can avoid the production of worm hole during fabricating tungsten plug, the Si leakage is avoided, and the electric characteristic become better as compared to the plug with ionized PVD TiN layer. Referring to FIG. 8, a tungsten plug 41 is formed in the contact by the deposition of tungsten followed by tungsten etchback or tungsten chemical mechanical polish. Because the conformity of the CVD layer is very good, the step coverage of the TiN layer 37 in the present invention is very good. Thus the leakage issue and the worm hole are overcome in the method provided by the present invention. The barrier (TiN) layer is formed by a chemical vapor deposition (CVD) using $TiCl_3$, $NH_3$ TDMAT or TDEAT as a source, and at a temperature of about 200° C. to 700° C.

As will be understood by persons skilled in the art, the foregoing preferred embodiment of the present invention is illustrative of the present invention rather than limiting the present invention. Having described the invention in connection with a preferred embodiment, for example, if the various sources used to perform the CVD is utilized to produce the barrier layer in the preferred embodiment, the modification will now suggest itself to those skilled in the art. While the preferred embodiment of the invention has been illustrated and described, it will be appreciated that various changes can be made therein without departing from the spirit and scope of the invention.

What is claimed is:

1. A method for forming a tungsten plug in a semiconductor wafer, said method comprising:

developing a photoresist layer on said semiconductor wafer, said semiconductor wafer comprising a dielectric layer and an underlying silicon contained layer;

etching said dielectric layer to form a contact opening, said silicon contained layer being exposed by said contact opening;

stripping said photoresist layer;

forming a titanium layer on said dielectric layer and said exposed silicon contained layer, a first portion of said titanium layer being on said dielectric layer, a second portion of said titanium layer being on said exposed silicon contained layer, due to an aspect ratio of said contact opening, when forming said titanium layer, said second portion of said titanium layer at a center of said contact opening being thicker than said second portion of said titanium layer at a corner of said contact opening;

removing said first portion of said titanium layer;

forming a barrier layer on said dielectric layer and said second portion of said titanium layer by a chemical vapor deposition (CVD), said barrier layer being formed by said chemical vapor deposition using a material as a source, said material can be chosen from the group consisting of: TiCl3, NH3 and TDMAT and TDEAT, said titanium layer being formed other than said chemical vapor deposition; and forming said tungsten plug in said contact opening using a $WF_6$, said barrier layer being used for preventing said $WF_6$ from reacting with said titanium layer and said silicon contained layer.

2. The method as claim 1, wherein said silicon contained layer is a silicon substrate.

3. The method as claim 1, wherein said titanium layer is formed by an ionized physical vapor deposition (ionized PVD).

4. The method as claim 1, wherein said titanium layer is formed by a physical vapor deposition using a collimator.

5. The method as claim 1, wherein said barrier layer is a titanium nitride (TiN) layer.

* * * * *